(12) United States Patent
Shahriari et al.

(10) Patent No.: US 12,306,396 B2
(45) Date of Patent: May 20, 2025

(54) ELECTRONIC DEVICE COMPRISING AN ELECTROWETTING DEVICE

(71) Applicant: QUALCOMM Incorporated, San Diego, CA (US)

(72) Inventors: Arjang Shahriari, San Diego, CA (US); Ajay Vadakkepatt, San Diego, CA (US); Ajit Kumar Vallabhaneni, Carlsbad, CA (US); Melika Roshandell, Carlsbad, CA (US); Mahdi Nabil, San Diego, CA (US); Mehdi Saeidi, San Diego, CA (US); Paul Penzes, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 874 days.

(21) Appl. No.: 17/485,140

(22) Filed: Sep. 24, 2021

(65) Prior Publication Data

US 2023/0099295 A1     Mar. 30, 2023

(51) Int. Cl.
| | | |
|---|---|---|
| *G02B 26/00* | (2006.01) | |
| *G06F 1/20* | (2006.01) | |
| *G09G 3/34* | (2006.01) | |
| *H01L 23/473* | (2006.01) | |
| *H05K 7/20* | (2006.01) | |

(52) U.S. Cl.
CPC ............ *G02B 26/005* (2013.01); *G06F 1/20* (2013.01); *G09G 3/348* (2013.01); *H01L 23/473* (2013.01); *H05K 7/20272* (2013.01); *H05K 7/20281* (2013.01); *H05K 7/20445* (2013.01); *G06F 2200/201* (2013.01)

(58) Field of Classification Search
CPC .. G02B 26/005; G02B 6/0085; G02B 6/4269; G02B 6/3814; G09G 3/348; G06F 1/20; G06F 1/206; H01L 23/367; H01L 23/473; H01L 2225/06589; H05K 7/20; H05K 7/20272; H05K 7/20282; H05K 7/20336; H05K 7/20445
See application file for complete search history.

(56) References Cited

U.S. PATENT DOCUMENTS

| | | |
|---|---|---|
| 9,151,520 B2 | 10/2015 | Despesse |
| 9,735,089 B2 | 8/2017 | Kumar et al. |
| 2008/0047701 A1 | 2/2008 | Bahadar et al. |
| 2009/0008064 A1 | 1/2009 | Nicole et al. |
| 2009/0074595 A1 | 3/2009 | Chen et al. |

(Continued)

OTHER PUBLICATIONS

Bindiganavale G., et al., "Study of Hotspot Cooling using Electrowetting on Dielectric Digital Microfluidic System", 2014 IEEE 27th International Conference on Micro Electro Mechanical Systems (MEMS), IEEE, Jan. 26, 2014, pp. 1039-1042, XP032579065.

(Continued)

*Primary Examiner* — Amir A Jalali
(74) *Attorney, Agent, or Firm* — Loza & Loza, LLP

(57) ABSTRACT

A device that includes a first integrated device, a second integrated device configured to be electrically coupled to the first integrated device and an electrowetting device configured to be electrically coupled to the second integrated device. The electrowetting device is configured to redistribute heat across a back surface of the device by looping a liquid in the electrowetting device, along the back surface of the device.

36 Claims, 13 Drawing Sheets

(56) References Cited

U.S. PATENT DOCUMENTS

| | | | |
|---|---|---|---|
| 2011/0304987 A1* | 12/2011 | Oprins | H01L 23/4735 |
| | | | 361/699 |
| 2013/0026040 A1* | 1/2013 | Cheng | B01L 3/502792 |
| | | | 204/600 |
| 2015/0378146 A1* | 12/2015 | Phaff | G02B 26/005 |
| | | | 359/290 |
| 2016/0375440 A1* | 12/2016 | Ludwig | G01N 27/44791 |
| | | | 204/601 |
| 2017/0092564 A1* | 3/2017 | Kumar | H01L 25/0655 |
| 2018/0001286 A1* | 1/2018 | Wu | B01F 35/92 |
| 2018/0221882 A1* | 8/2018 | Roberts | G01N 27/44704 |
| 2019/0004576 A1* | 1/2019 | Ho | G06F 1/206 |
| 2019/0201902 A1* | 7/2019 | Fobel | G01F 22/00 |
| 2020/0041445 A1* | 2/2020 | Chen | G01N 27/4145 |
| 2021/0231606 A1* | 7/2021 | Gupta | G01N 27/44791 |

OTHER PUBLICATIONS

International Search Report and Written Opinion—PCT/US2022/041398—ISA/EPO—Nov. 10, 2022.
Hale R.S., et al., "Electrowetting-Based Microfluidic Operations on Rapid-Manufactured Devices for Heat Pipe Applications", Journal of Micromechanics and Microengineering, vol. 27, Jun. 2, 2017, 11 pages, https://doi.org/10.1088/1361-6439/aa711f.

* cited by examiner

BACK SIDE VIEW

FRONT SIDE VIEW

ELECTRONIC DEVICE COMPRISING AN ELECTROWETTING DEVICE

FIELD

Various features relate to electronic devices with an electrowetting device.

BACKGROUND

Electronic devices include components, such as integrated devices, that generate heat. The heat that is generated by these components can build up and affect the performance of these components. Thus, finding a way to efficiently and effectively dissipate heat in electronic devices is important. Electronic devices that are portable and/or handheld devices are small devices that are prone to local hotspot(s) from the heat that is generated by the components inside the electronic devices. These local hotspot(s) can cause an uncomfortable and/or undesirable experience for a user of the electronic device because the hotspot(s) of the electronic device may cause the electronic device to be too hot for the user to hold and/or wear. Therefore, there is an ongoing need for electronic devices with improved thermal management and hotspot reduction.

SUMMARY

Various features relate to electronic devices with an electrowetting device.

One example provides a device comprising that includes a first integrated device, a second integrated device configured to be electrically coupled to the first integrated device, and an electrowetting device configured to be electrically coupled to the second integrated device. The electrowetting device is configured to redistribute heat across a surface of the device by moving a liquid in the electrowetting device, along a surface element of the device.

Another example provides a method for thermal management of a device. The method monitors at least one temperature of the device. The method determines whether the at least one temperature violates at least one temperature criterion. The method activates an electrowetting device upon determining that the at least one temperature violates the at least one temperature criterion, wherein activating the electrowetting device causes the electrowetting device to redistribute heat across a surface of the device by moving a liquid in the electrowetting device, along a surface element of the device.

Another example provides an apparatus that includes an integrated device and a means for electrowetting configured to be electrically coupled to the integrated device. The means for electrowetting is configured to redistribute heat across a surface of the device by moving a liquid in the means for electrowetting, along a surface element of the apparatus.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device (e.g., electronic device, handheld electronic device, wearable electronic device) that includes a first integrated device, a second integrated device configured to be electrically coupled to the first integrated device and an electrowetting device configured to be electrically coupled to the second integrated device. The electrowetting device is configured to redistribute heat across a surface of the device by moving a liquid in the electrowetting device, along a surface element of the device. The first integrated device may be configured to control an operation of the electrowetting device through the second integrated device. The electrowetting device may be configured to redistribute heat across a back surface of the device to provide an improved temperature distribution across the back surface of the device. The electrowetting device helps reduce and/or eliminate hotspots over the surface of a device. The electrowetting device also helps with thermal management of the device without having to throttle the first integrated device.

Exemplary Device Comprising an Electrowetting Device

Figure 2:
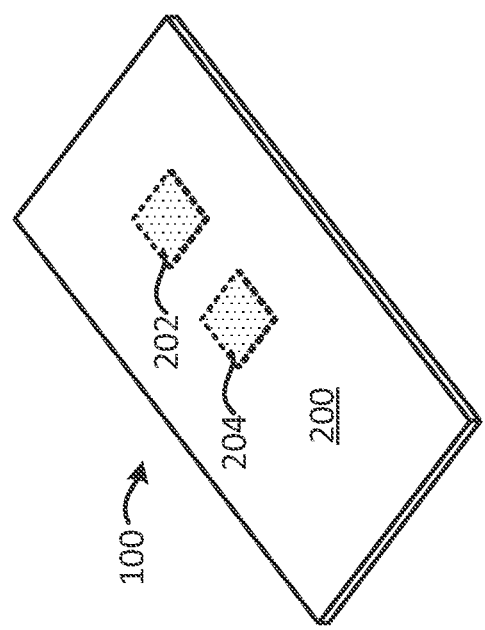
FIG. 2 illustrates a back side view of a handheld mobile device.
Figure 1:
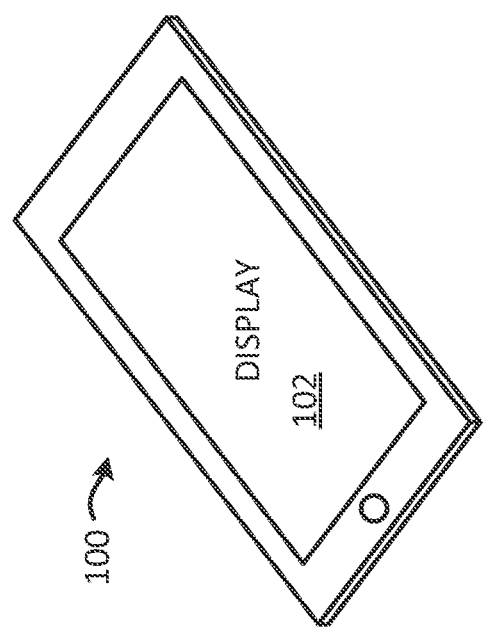
FIG. 1 illustrates a front side view of a handheld mobile device.
Figure 3:
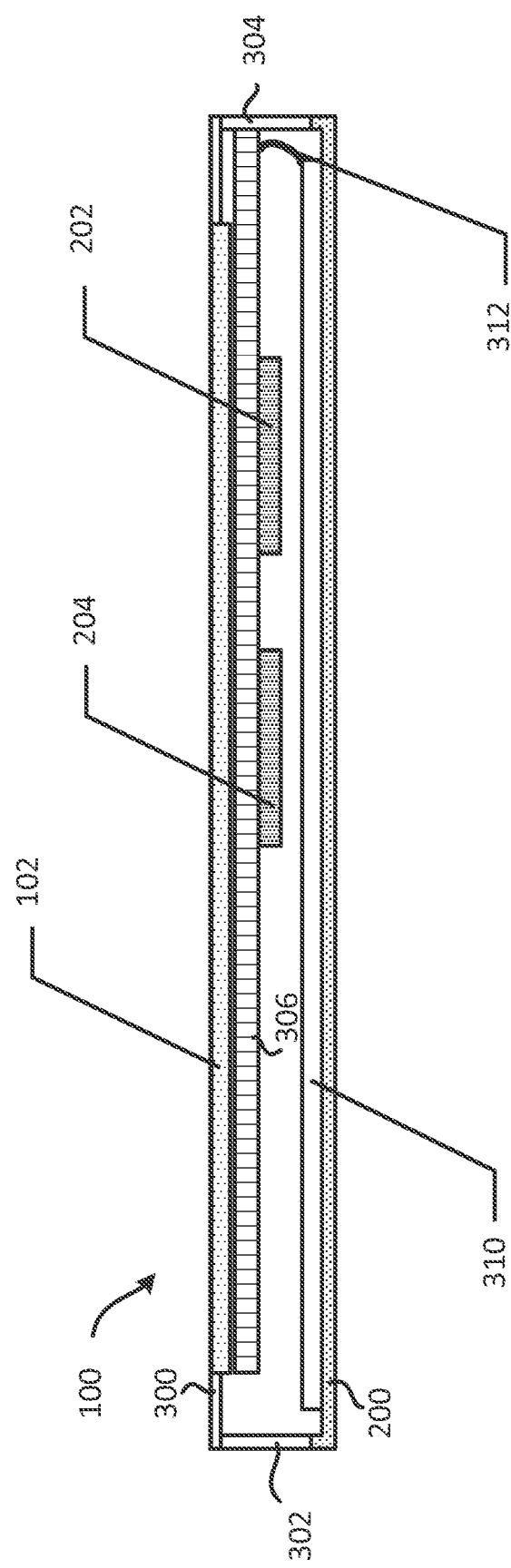
FIG. 3 illustrates a cross sectional profile view of a handheld mobile device.

FIGS. 1-3 illustrate various views of a device 100 that includes an electrowetting device. FIG. 1 illustrates a front side view of the device 100 that includes a display 102 (e.g., front display, main display). FIG. 2 illustrates a back side view of the device 100 that includes a back surface 200, an integrated device 202 and an integrated device 204. The back side may include one or more surface elements, such as a back side cover, a casing, a back side display, or the like which form at least part of the back surface of the device 100. Likewise, the front side and/or side surface(s) may include one or more surface elements, such as a front side or main display, a casing, or the like which form at least part of the front surface of the device. The integrated device 202 and the integrated device 204 are located inside the device 100. The integrated device 202 and the integrated device 204 are located between the display 102 and the back surface 200. The integrated device 202 may be processor. The integrated device 204 may be a power management integrated device (e.g., power management integrated circuit (PMIC)). The back side of the device 100 may further include a secondary display (not shown) integrated in the back surface 200. Without prejudice, the following description relates to a device with a single display in the front side of the device to demonstrate features of the present disclosure. The present disclosure is, however, not limited to a device with a single display in the front side but equally applies to devices with more than one display integrated in the front and/or back sides of the device. Similarly, the present disclosure may be applied to redistribute heat across a front surface and/or side surface(s) of the device by moving a liquid in an electrowetting device as described in the following along a surface element of a front side and/or side surface(s) of the device (e.g., next to a surface element of a front side and/or side surfaces(s) of the device). Furthermore, two or more electrowetting devices as described in the following may be provided to move respective liquids along (e.g., next to) the front surface, back surface and/or the side surface(s) of the device, respectively.

FIG. 3 illustrates a cross sectional profile view of the device 100. As shown in FIG. 3, the device 100 includes the display 102, the back surface 200, a front surface 300, a surface 302 and a surface 304. The device 100 also includes the integrated device 202, the integrated device 204, a board 306, an electrowetting device 310 and an electrical connection 312. As will be further described below, the electrowetting device 310 helps redistribute heat that may be generated at one or more spots of the device 100 by moving a liquid as a heat carrier. The liquid may be an electrically conducting liquid such as water or water including an electrolyte.

The integrated device 202 and the integrated device 204 may be mechanically and/or electrically coupled to the board 306. The board 306 may include a printed circuit board (PCB). The board 306 may be configured to be coupled to the electrowetting device 310 through the electrical connection 312. The electrical connection 312 may include wiring and/or interconnects. The electrical connection 312 is configured to provide at least one electrical path between the board 306 and the electrowetting device 310. The integrated device 202 and/or the integrated device 204 may be configured to be electrically coupled to the electrowetting device 310 through the board 306 and the electrical connection 312. Alternatively, the integrated device 202 and/or the integrated device 204 may be configured to be electrically coupled to the electrowetting device 310 through a separate electrical connection, without involving the board 306. The board 306 may include at least one dielectric layer and a plurality of board interconnects. As will be further described below in detail, in some implementations, the integrated device 202 and/or the integrated device 204 may control the operation of the electrowetting device 310. In some implementations, the integrated device 202 (e.g., first integrated device, second integrated device) may control the operation of the electrowetting device 310 through the integrated device 204 (e.g., first integrated device, second integrated device). One or more voltages may be provided to the electrowetting device 310 through the electrical connection 312. Different implementations may provide the voltages to the electrowetting device 310 differently. As will be further described below, the voltages may be provided through the integrated device 202 and/or the integrated device 204.

FIG. 3 illustrates the electrowetting device 310 located next to the back surface 200 of the device 100. In some implementations, the electrowetting device 310 may be implemented at least partially in the back surface 200 of the device 100. More specifically, the electrowetting device 310 may be implemented at least partially in a surface element of the back side of the device 100. In other implementations, the electrowetting device 310 may contact an extended part of the surface element, such as the back surface 200 in FIG. 3, to allow for heat transfer between the surface element and the below described channel structure of the electrowetting device 310 at various locations of the back surface 200. The back surface 200 may be a surface that is opposite to the display 102 of the device 100. It is noted that the electrowetting device 310 may be located next to and/or implemented in other surfaces of the device 100, such as a front surface and/or side surface(s). In this case, the electrowetting device may be implemented in a surface element of the front side and/or side surface(s) of the device or be provided in contact with an extended part of the surface element.

An integrated device (e.g., 202, 204) may include a die (e.g., semiconductor bare die). The integrated device may include a power management integrated circuit (PMIC). The integrated device may include integrated circuits. The integrated device may include an application processor (e.g., central process unit (CPU), graphics processing unit (GPU), neural network processor, multimedia processor). The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 202, 204) may include at least one electronic circuit (e.g., first electronic circuit, second electronic circuit, etc. . . . ). The integrated device 202 and/or the integrated device 204 may further include combinations of one or more of the above-mentioned elements.

Figure 4:
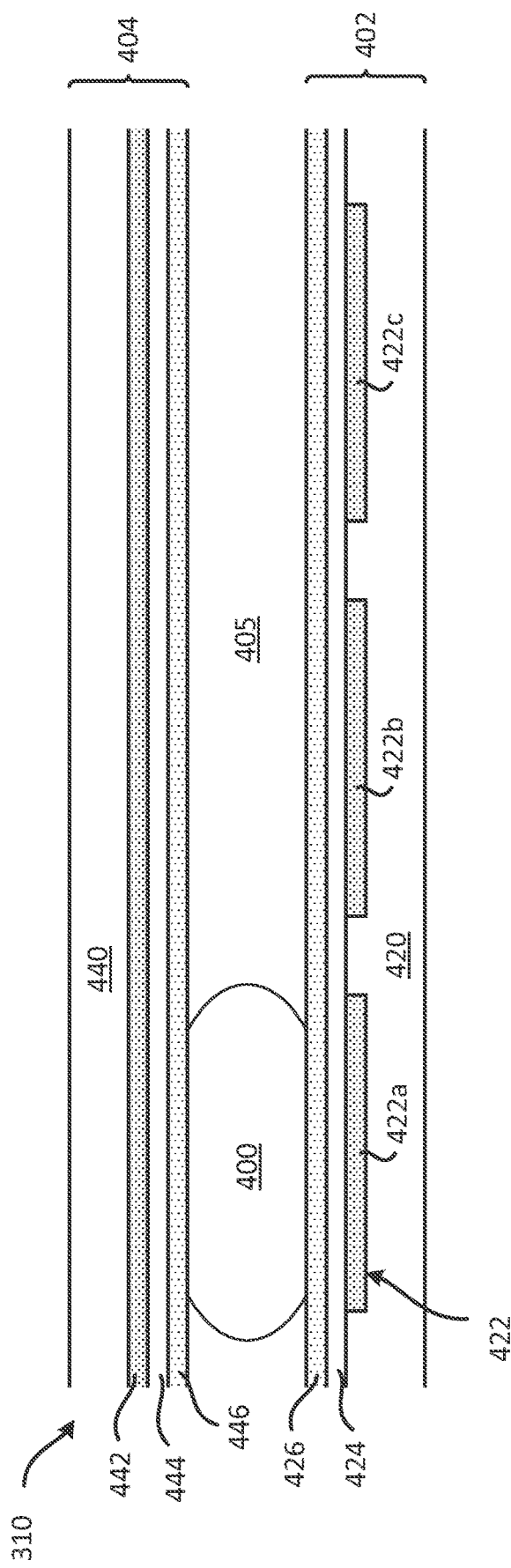
FIG. 4 illustrates a cross sectional profile view of an electrowetting device.
Figure 5:
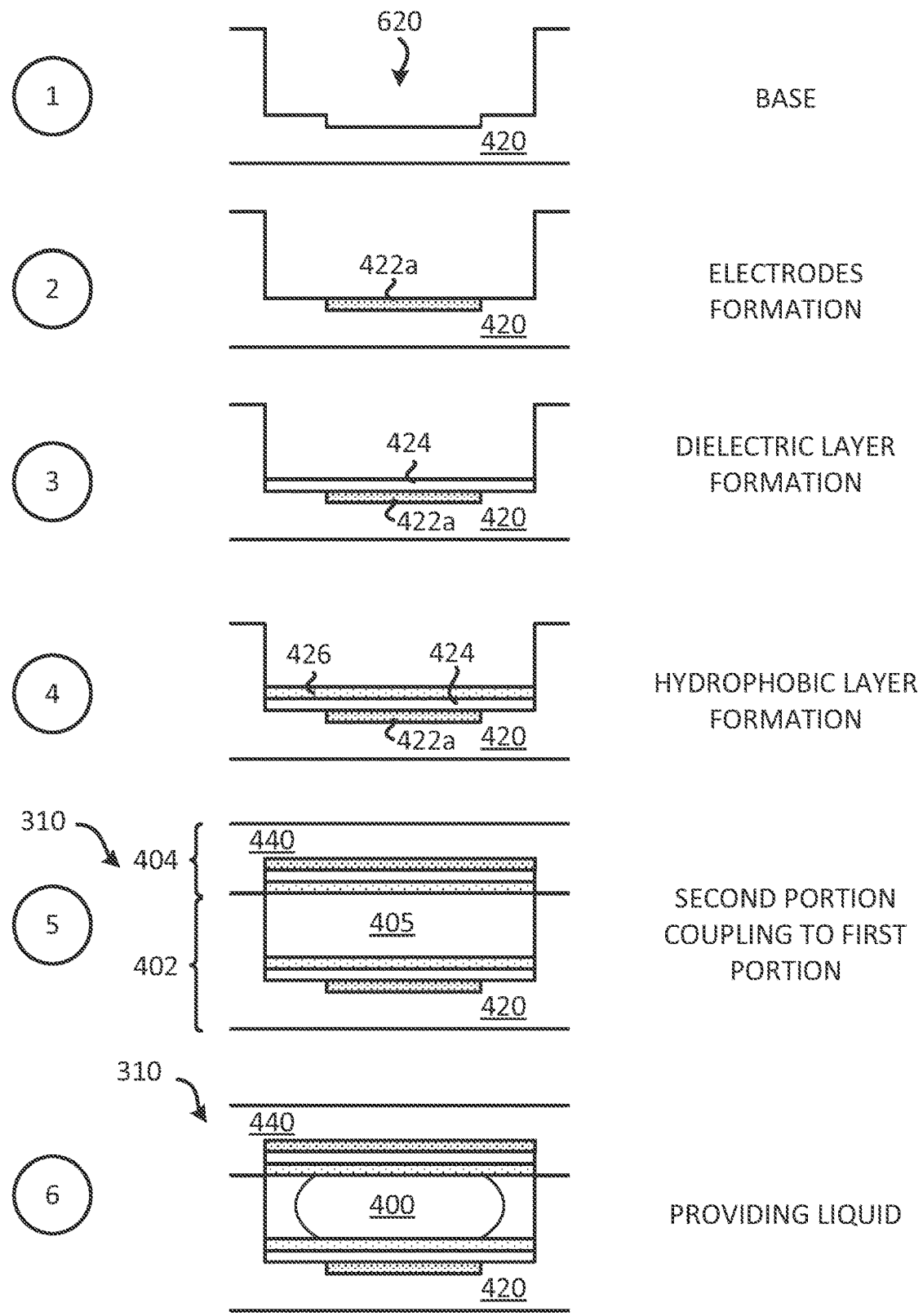
FIG. 5 illustrates an exemplary sequence for fabricating an electrowetting device.

FIG. 4 illustrates a close-up cross-sectional profile view of the electrowetting device 310. The electrowetting device 310 may be an example of a means for electrowetting. The electrowetting device 310 may include a first portion 402, a second portion 404, at least one channel 405 and a liquid 400. The first portion 402 is coupled to the second portion 404, and vice versa. At least one channel 405 is located between the first portion 402 and the second portion 404. The first portion 402 may be provided opposite of the second portion 404 to form the at least one channel 405 between the first portion 402 and the second portion 404. Side walls (not shown) of the at least one channel 405 may be formed by one or more separate layers and/or by the first portion 402 and/or the second portion 404. In some implementations, the first base 420 and/or the second base 440 may form the side walls of the at least one channel 405. FIG. 5 shows an exemplary implementation where the side walls of the at least one channel 405 are formed by the first base 420. In some implementations, the side walls may be provided (e.g., coated) with a hydrophobic layer that may be provided as part of the first hydrophobic layer 426 and/or the second hydrophobic layer 446 described below. The liquid 400 is located in at least one channel 405. The liquid 400 may include at least one liquid droplet. In other words, at least one droplet of a liquid may be provided inside the at least one channel 405. In some implementations, one droplet is provided in each of the at least one channel 405. In other cases, more than one isolated droplet is provided in one, several, or all of the at least one channel 405. An example of a liquid 400 is water. However, the liquid 400 may include one or more other electrically conducting liquids.

The first portion 402 may include a first base 420, such as a substrate or base layer, a plurality of electrodes 422, and a first dielectric layer 424. In some implementations, the first portion 402 may further include a first hydrophobic layer 426. The first portion 402 may also include a plurality of interconnects (not shown) coupled to the plurality of electrodes 422. The plurality of electrodes may be arranged along the at least one channel 405. A distance between neighboring electrodes may be chosen to enable moving a droplet of the liquid 400 along the at least one channel 405 by applying an electrical voltage to respective electrodes along the at least one channel 405. The voltage at an electrode may produce an electrical field that causes the liquid 400 (e.g., droplet of liquid) to move towards and over the electrode with a voltage. A distance between neighboring electrodes may be chosen not to exceed a maximum distance which may correspond to a diameter of a droplet in the channel 405 without application of an electric field. The plurality of electrodes 422 may include a first electrode 422a, a second electrode 422b and a third electrode 422c. The plurality of electrodes 422 may be located over or on the first base 420 or may be integrated in the first base 420. The first dielectric layer 424 may be located over or on the first base 420 and the plurality of electrodes 422. The first hydrophobic layer 426 may be located over or on the first dielectric layer 424.

The second portion 404 may include a second base 440, such as a substrate or base layer, a first metal layer 442, and a second dielectric layer 444. The second portion 404 may further include a second hydrophobic layer 446. The second portion 404 may also include a plurality of interconnects (not shown) coupled to the first metal layer 442. The first metal layer 442 may be configured to be coupled to ground. In the presentation of FIG. 4, the first metal layer 442 may be located below or under the second base 440. The second dielectric layer 444 may be located below the second base 440 and below or under the first metal layer 442. The second hydrophobic layer 446 may be located below or under the second dielectric layer 444. In some implementations, the second portion 404 may include a plurality of electrodes (not shown) instead of the first metal layer 442. The plurality of electrodes of the second portion 404 may be provided to correspond to the plurality of electrodes of the first portion 402, e.g., by arranging corresponding electrodes of the first and second portions on opposite sides of the channel 405. Corresponding electrodes of the first and second portions may have a corresponding shape. The plurality of electrodes of the second portion 404 may be controlled (e.g., applied with a voltage), independently of the plurality of electrodes of the first portion 402. In some implementations, the electrodes of the second portion 404 may be controlled (e.g., applied with a voltage), together with the electrodes of the first portion 402. By way of example, voltages applied to electrodes of the second portion 404 may be inverted or completely out of phase (anti-phased) compared to corresponding voltages applied to electrodes of the first portion 402.

The liquid 400 is located in at least one channel 405. The liquid 400 may move through at least one channel 405 of the electrowetting device 310. A hydrophobic material is a type of material that repels water and/or does not mix well with water. The hydrophobic material helps the water travel better in the at least one channel. As will be further described below in at least FIG. 6, one or more voltages may be applied to the plurality of electrodes 422 to move the liquid 400 through the at least one channel 405.

The electrowetting device 310 may be coupled (e.g., mechanically coupled) to a surface of a device such that the second portion 404 faces the back surface of the device. In some implementations, the second portion 404 may be provided on an inner surface of a surface element, portion, or component, such as a casing, of the device forming the back surface of the device. However, in some implementations, the electrowetting device 310 may be coupled to a surface of a device such that the first portion 402 faces the back surface of the device. Consequently, the first portion may be provided on an inner surface of a surface element, portion, or component of the device forming the back surface of the device. The electrowetting device 310 may be implemented in a device in any location, orientation and/or direction of the device. Having described an electrowetting device, a method for fabricating an electrowetting device will now be described below.

Exemplary Sequence for Fabricating an Electrowetting Device

FIG. 5 illustrates an exemplary sequence for providing or fabricating an electrowetting device. In some implementations, the sequence of FIG. 5 may be used to provide or fabricate the electrowetting device 310. However, the process of FIG. 5 may be used to fabricate any electrowetting device in the disclosure.

It should be noted that the sequence of FIG. 5 may combine one or more stages in order to simplify and/or clarify the sequence for providing or fabricating an electrowetting device. In some implementations, the order of the processes may be changed or modified. In some implementations, one or more of processes may be replaced or substituted without departing from the scope of the disclosure. It is noted that the orientation of the electrowetting device shown in FIG. 5 is different than the orientation of the electrowetting device shown in FIG. 4.

Stage 1 illustrates a state after a first base 420 is provided. The first base 420 may be made of any type of material, such as a substrate material. The first base 420 may include at least one trench 620 that may, for instance, be formed by etching the base material using as mask. The at least one trench 620 may become at least one channel 405 for an electrowetting device. The first base 420 may include side walls.

Stage 2 illustrates a state after a plurality of electrodes 422 (which includes electrode 422a) is provided (e.g., formed) over or on the first base 420. A plurality of interconnects (not shown) may also be provided in and/or over and/or on the first base 420. The plurality of interconnects may be configured to be electrically coupled to the plurality of electrodes 422. The plurality of electrodes 422 and/or the plurality of interconnects may be provided using a micro and/or nano fabrication process. In some implementations, the plurality of electrodes 422 and/or the plurality of interconnects may be provided using a plating process.

Stage 3 illustrates a state after a first dielectric layer 424 is provided over or on the first base 420 and the plurality of electrodes 422. A deposition process, a coating process, and/or sputtering process may be used to form the first dielectric layer 424. The first dielectric layer 424 may include a polymer.

Stage 4 illustrates a state after a first hydrophobic layer 426 is provided over or on the first dielectric layer 424. A spin coat process and/or a sputter coat process may be used to provide the first hydrophobic layer 426. Stage 4 may illustrate an example of first portion 402 of an electrowetting device. It is noted that the first portion 402 may have different shapes, designs, and/or configurations. The second portion 404 as described in the disclosure, may be fabricated in a similar fashion as described in Stages 1-4.

Stage 5 illustrates a state after the second portion 404 is mechanically coupled to the first portion 402 forming an electrowetting device 310. At least one channel 405 may be formed between the first portion 402 and the second portion 404 by coupling the second portion 404 to the first portion 402. The at least one channel 405 may be based on the at least one trench 620. An adhesive may be used to couple the first portion 402 and the second portion 404. However, the first portion 402 may be coupled to the second portion 404 differently.

Stage 6 illustrates a state after the liquid 400 is provided in the at least one channel 405. The liquid 400 may be provided through an opening in the electrowetting device 310 that is subsequently closed. In some implementations, the liquid 400 may be provided before the second portion 404 is coupled to the first portion 402.

Exemplary Sequence for Operation of an Electrowetting Device

Figure 6:
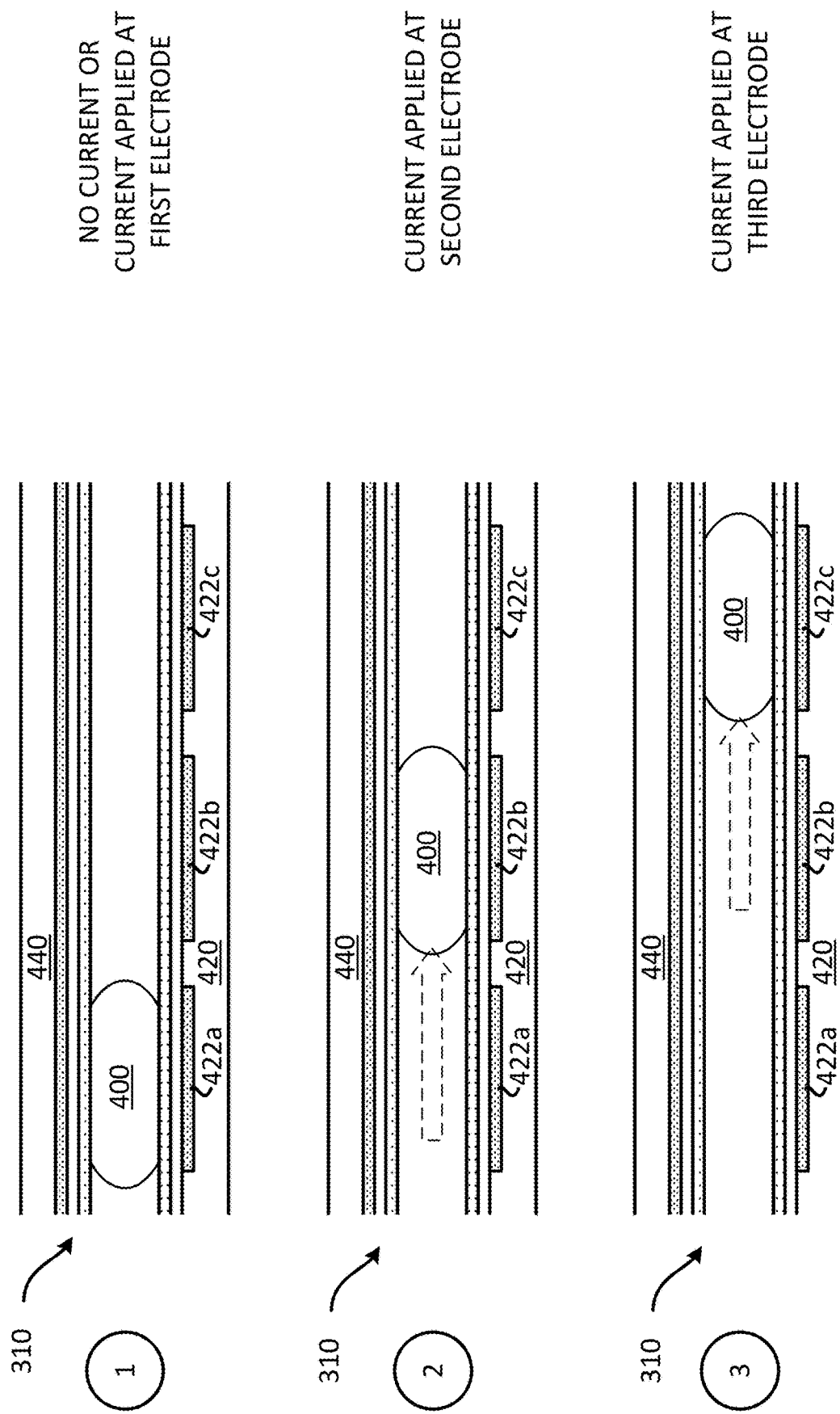
FIG. 6 illustrates an exemplary sequence of an electrowetting device in operation.

FIG. 6 illustrates an exemplary sequence of an operation of an electrowetting device. It should be noted that the sequence of FIG. 6 may combine one or more stages in order to simplify and/or clarify the sequence for operating an electrowetting device. In some implementations, the order of the processes may be changed or modified. In some implementations, one or more of the processes may be replaced or substituted without departing from the scope of the disclosure.

Stage 1 illustrates a state of the electrowetting device 310 when there is no voltage applied to any of the electrodes or when there is a voltage that is applied to the first electrode 422a. During this state, the liquid 400 is located over the first electrode 422a. The liquid 400 includes a liquid droplet. As will be further described below, the voltage may be provided from one or more integrated devices.

Stage 2 illustrates a state when no voltage is applied to the first electrode 422a (e.g., voltage to the first electrode 422a is turned off) and a voltage is applied to the second electrode 422b instead (e.g., voltage to the second electrode 422b is turned on). The voltage applied to the second electrode 422b may produce an electrical field. This electrical field causes the liquid 400 to move toward and over the second electrode 422b. As the liquid 400 moves over the second electrode 422b, any heat and/or energy located in the liquid 400 also moves over the second electrode 422b.

Stage 3 illustrates a state when no voltage is applied to the second electrode 422b (e.g., voltage to the second electrode 422b is turned off) and a voltage is applied to the third electrode 422c instead (e.g., voltage to the third electrode 422c is turned on). The voltage applied to the third electrode 422c may produce an electrical field. This electrical field causes the liquid 400 to move toward and over the third electrode 422c. As the liquid 400 moves over the third electrode 422c, any heat and/or energy located in the liquid 400 also moves over the third electrode 422c. By subsequently applying a voltage to a sequence of electrodes of the plurality of electrodes, a droplet of the liquid 400 may be moved along the channel. In other words, a voltage pulse moving along the sequence of electrodes pulls a droplet inside the channel along in the direction of the moving pulse. Control of the plurality of electrodes may be adapted to allow moving several isolated droplets along the channel by applying a corresponding number of voltage pulses to the plurality of electrodes.

FIG. 6 illustrates a sequence as the liquid 400 moves from left to right. However, the liquid 400 may be moved in any direction by applying the appropriate voltage to the appropriate electrodes. For example, the liquid 400 may be moved from the third electrode 422c to the second electrode 422b. In such an example, no voltage is applied to the third electrode 422c (e.g., voltage to the third electrode 422c is turned off) and a voltage is applied to the second electrode 422b instead (e.g., voltage to the second electrode 422b is turned on). The voltage applied to the second electrode 422b may produce an electrical field. This electrical field causes the liquid 400 to move toward and over the second electrode 422b. As the liquid 400 moves over the second electrode 422b, any heat and/or energy located in the liquid 400 also moves over the second electrode 422b.

Figure 7:
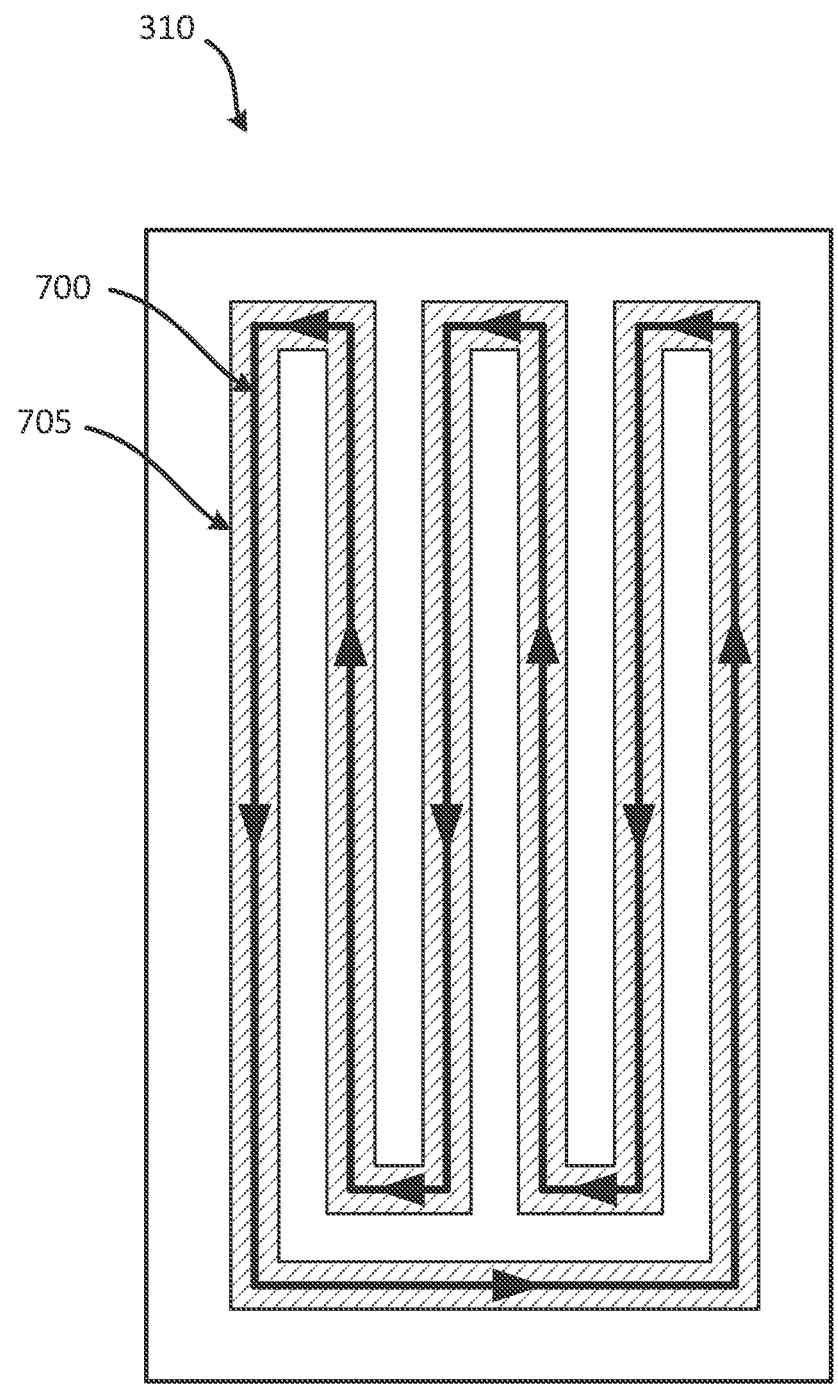
FIG. 7 illustrates an exemplary loop of at liquid in an electrowetting device.
Figure 8:
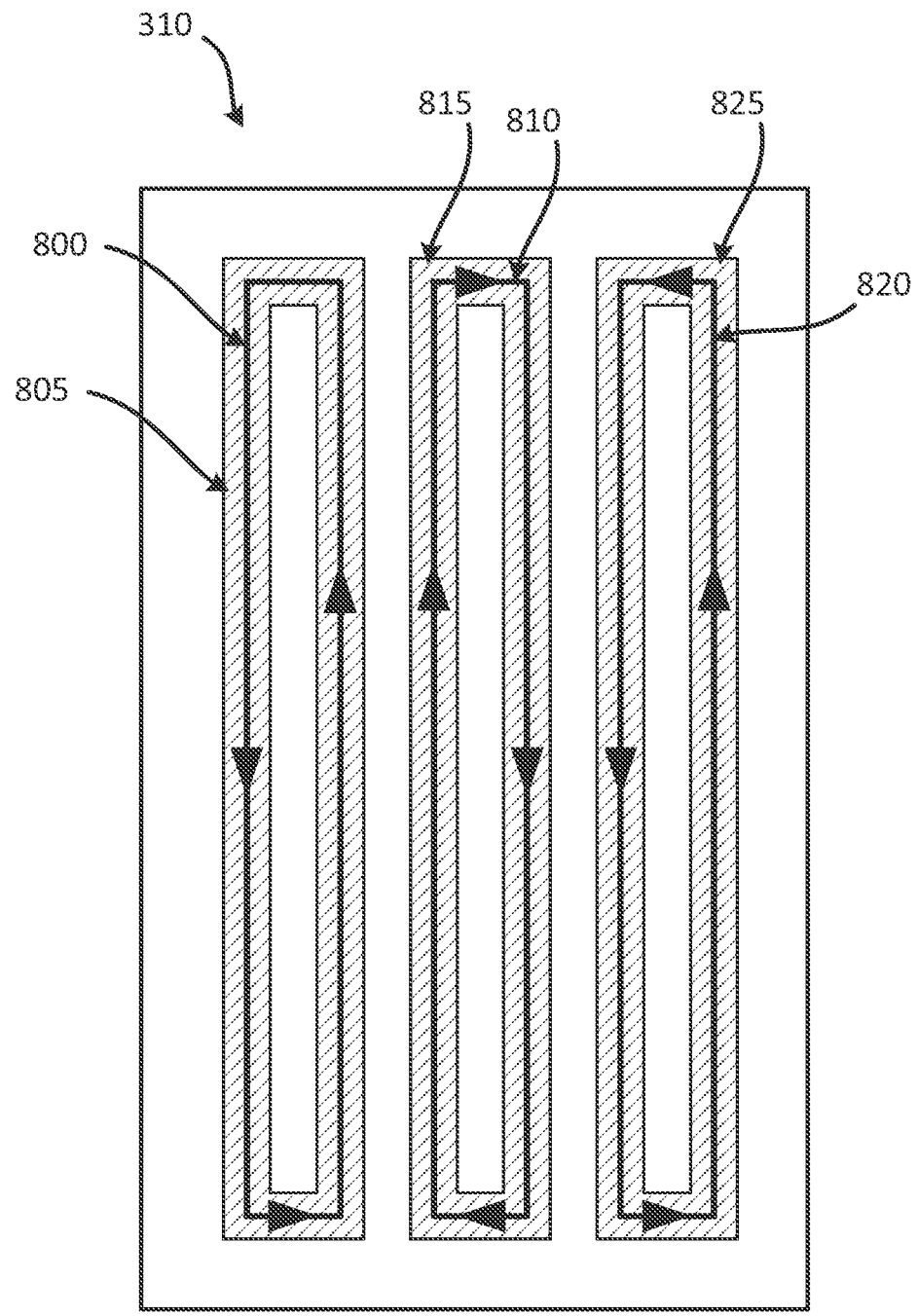
FIG. 8 illustrates exemplary loops of several liquids in an electrowetting device.

FIG. 6 illustrates one liquid droplet in the channel 405. However, the channel 405 may include several liquid droplets. The electrowetting device 310 may be configured to move several liquid droplets in the same direction and/or different directions. FIG. 6 illustrates how as the liquid 400 moves along the channel 405, heat that has been transferred to the liquid 400 at a location of the channel 405 with high temperature (higher than an average temperature along the channel), e.g., near or adjacent to integrated device 202 generating excess heat, may dissipate over different regions of the electrowetting device 310, e.g., by transferring heat from the liquid 400 to walls of the channel 405 at a location of the channels with low temperature (lower than the average temperature along the channel). In other words, moving the liquid 400 along the channel transports heat from at least one heat source to at least one heat sink and thus, distributes heat along the channel. FIGS. 7 and 8 below, illustrate examples of how the liquid 400 may be configured to flow in the electrowetting device 310 and along a surface of a device to evenly distribute heat and/or energy along the surface of a device.

FIG. 7 illustrates an exemplary flow 700 of the liquid 400 in the electrowetting device 310. The liquid 400 may include one or more liquid droplets. In the perspective of FIG. 7, the flow 700 travels in a counterclockwise direction. However, the flow 700 may travel in any direction, including a clockwise direction. In some implementations, the liquid 400 may oscillate back and forth. In some implementations, some of the liquid droplets may travel in a first direction and some of the liquid droplets may travel in a second direction in different sections of the channel. The flow 700 may be designed to distribute the heat over an area and/or surface as big as possible. The flow 700 may have any number of turns. FIG. 7 illustrates an electrowetting device with one continuous channel 705 through which the liquid 400 may travel through in the electrowetting device 310. The channel 705 may be an example of the channel 405. The form and arrangements of the channel generally defines possible flow patterns. In some implementations, the channel may form a closed loop, such as the channel 705 in FIG. 7. The closed loop may be simply O-shaped or involve one or more turns, windings, twists, curves, recesses, or the like, such as the channel 705 in FIG. 7. The channel may be designed and arranged to connect one or more heat sources such as regions of the device where one or more integrated devices are located with one or more heat sinks such as regions of the device where little or no heat is generated during operation. The channel may be formed or include a linear and/or non-linear segment in which the liquid may oscillate back and forth. Many different shapes, forms and arrangements of the channel may be chosen and are in line with the present disclosure.

The flow 700 may be configured to move the liquid 400 in a closed loop along the surface (e.g., back surface) of the device. After the liquid 400 has looped around several times along the surface of the device, any heat that may be generated or accumulated over one or more spots, is evenly and distributed along the surface of the device, effectively eliminating any hotspots in the surface of the device and/or providing a more uniform temperature distribution on the surface of the device. However, in some implementations, an electrowetting device may include several channels through which liquid may independently travel.

FIG. 8 illustrates an electrowetting device 310 that includes 3 channels (e.g., first channel, second channel, third channel) through which liquid may travel. Each of the 3 channels may form a closed loop, such as the O-shaped loops shown in FIG. 8. FIG. 8 illustrates an exemplary flow 800 for a first liquid through a first channel 805, an exemplary flow 810 for of a second liquid through a second channel 815, and an exemplary flow 820 for a third liquid through a third channel 825. The first liquid, the second liquid and the third liquid may each include at least one liquid droplet of the same or different liquid media, such as water. The first liquid, the second liquid and the third liquid may be part of the liquid 400. In some implementations, the use of separate channels provides more flexibility and helps better customize the thermal management of the heat distribution. The first channel 805, the second channel 815 and/or the third channel 825 may be examples of the channel 405.

In the perspective of FIG. 8, the flow 800 travels in a counterclockwise direction. The flow 810 travels in a clockwise direction. The flow 820 travels in a counterclockwise direction. However, the flow 800, the flow 810 and/or the flow 820 may travel in any direction. The liquid 400 may oscillate back and forth. In some implementations, some of the liquid droplets may travel in a first direction and some of the liquid droplets may travel in a second, different direction. The flow 800, the flow 810, and the flow 820 is/are configured to move the liquid 400 along the surface (e.g., back surface) of the device in one or more closed loops. After the liquid 400 has looped around several times along the surface of the device, any heat that may be generated or accumulated over one or more spots, is evenly and uniformly distributed along the surface of the device, effectively eliminating any hotspots in the surface of the device.

FIGS. 7 and 8 illustrate examples of possible flow configurations for an electrowetting device. However, it is noted that an electrowetting device may be configured with channels with different sizes, shapes, designs and/or configurations.

Figure 9:
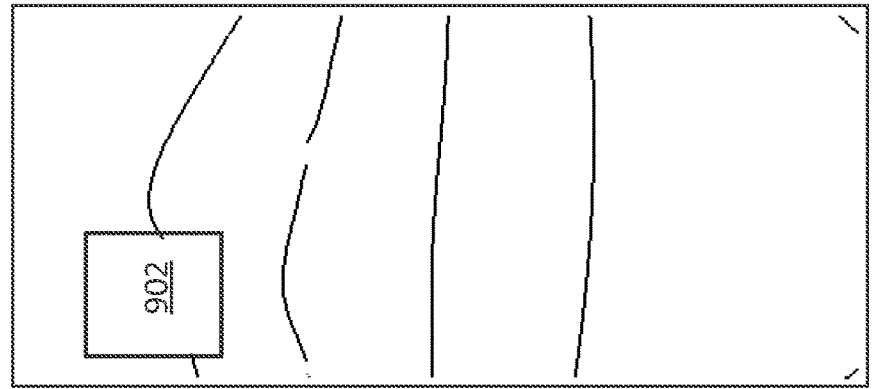
FIG. 9 illustrates temperate distributions for electronic devices with and without an electrowetting device.
Figure 9:
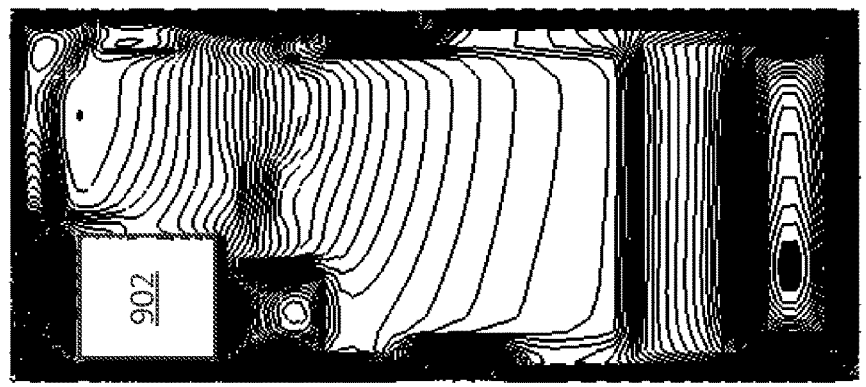

FIG. 9 illustrates examples of temperature distributions for a device with and without an electrowetting device according to the present disclosure. FIG. 9 illustrates a temperature distribution 900 of a surface of a device without an electrowetting device. As shown in FIG. 9, the temperature distribution 900 includes large variations (e.g., temperature gradient) in surface temperatures of the surface of the device. The temperature variations are illustrated by the temperature contour lines. In this example, the maximum-minimum temperature gradient is about 13 degrees Celsius. The temperature variations are illustrated by the lines on the surface of the device. The temperature distribution 900 also includes a hotspot in the upper right area of the surface of the device. In this example, the hotspot of the surface of the device can cause throttling of the device.

FIG. 9 also illustrates a temperature distribution 910 of a surface of a device with an electrowetting device. As shown in FIG. 9, the temperature distribution 910 includes smaller variations (e.g., temperature gradient) in surface temperatures of the surface of the device. As mentioned above, the temperature variations are illustrated by the temperature contour lines. In this example, the maximum-minimum temperature gradient is about 0.6 degrees Celsius. The temperature distribution 910 also does not include any hotspot. In this example, since there is no hotspot over the surface of the device, there is no need for throttling of the device because of surface temperature violations.

It is noted that the region 902 in the upper left corner of the temperature distribution represents the possible location of one or more camera lenses for the device. The region 902 of the surface of the device is not represented in the temperature contour lines of the surface of the device. The region 902 of the surface of the device may not be used and/or considered when implementing the electrowetting device.

Figure 10:
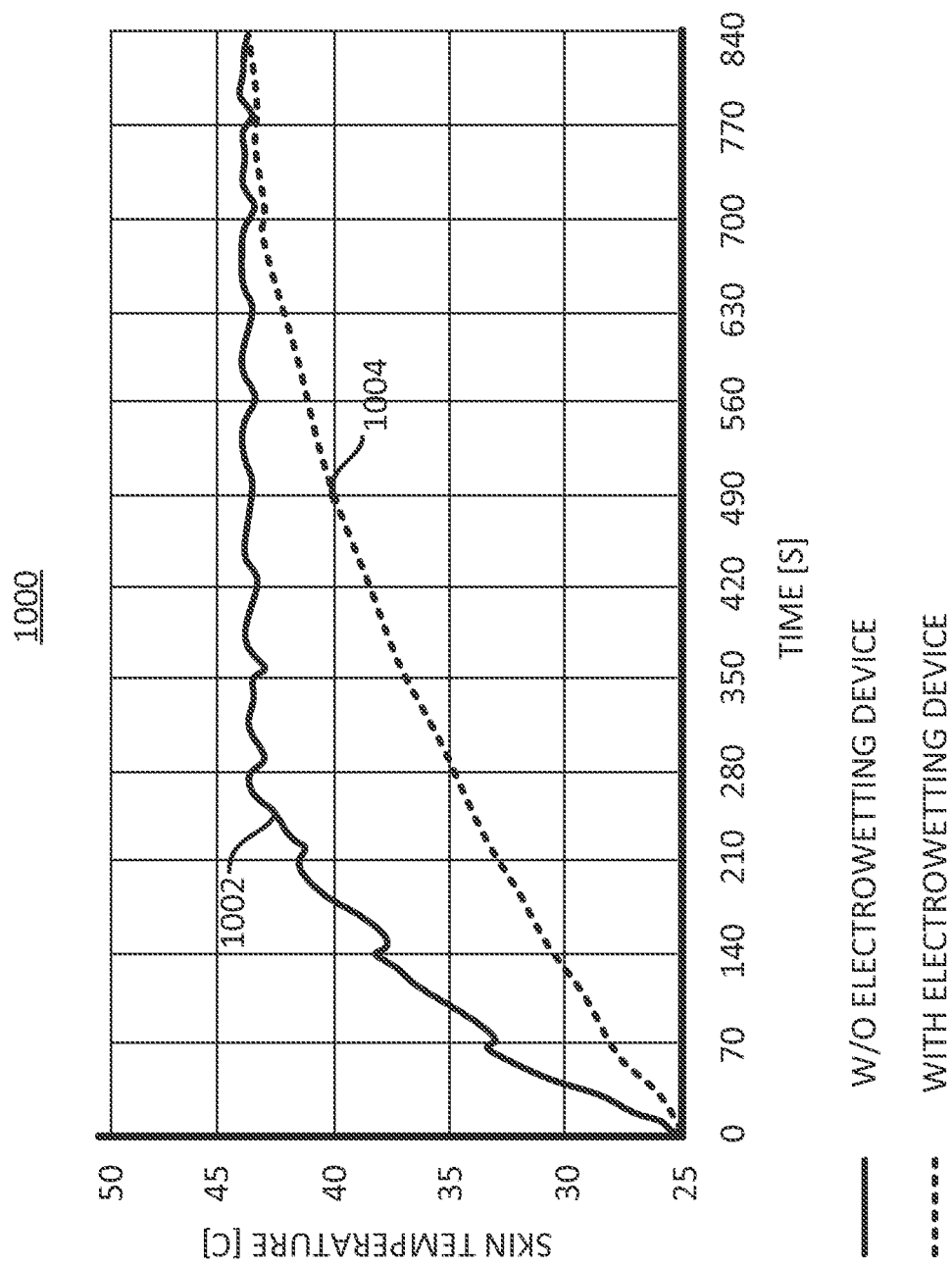
FIG. 10 illustrates a graph of skin temperate ramp-up rate over time for electronic devices with and without an electrowetting device.

FIG. 10 illustrates a graph 1000 of skin temperate ramp-up rate over time for electronic devices with and without an electrowetting device according to the present disclosure. FIG. 10 illustrates a temperature profile 1002 over time of a surface of a device without an electrowetting device. As shown in FIG. 10, the temperature profile 1002 shows that the surface temperature (e.g., skin temperature) reaches about 43 degrees Celsius in under 280 seconds. FIG. 10 also illustrates a temperature profile 1004 over time of a surface of a device with an electrowetting device. As shown in FIG. 10, the temperature profile 1004 shows that the surface temperature reaches about 43 degrees Celsius in about 770 seconds, which is substantially longer than that of the device without the electrowetting device. This enables the device with the electrowetting device to operate for a longer period of time without having to potentially throttle the performance of the integrated device(s) of the device based on skin temperature violations. This also allows the device to operate on average at a faster rate over a certain period of time.

Figure 11:
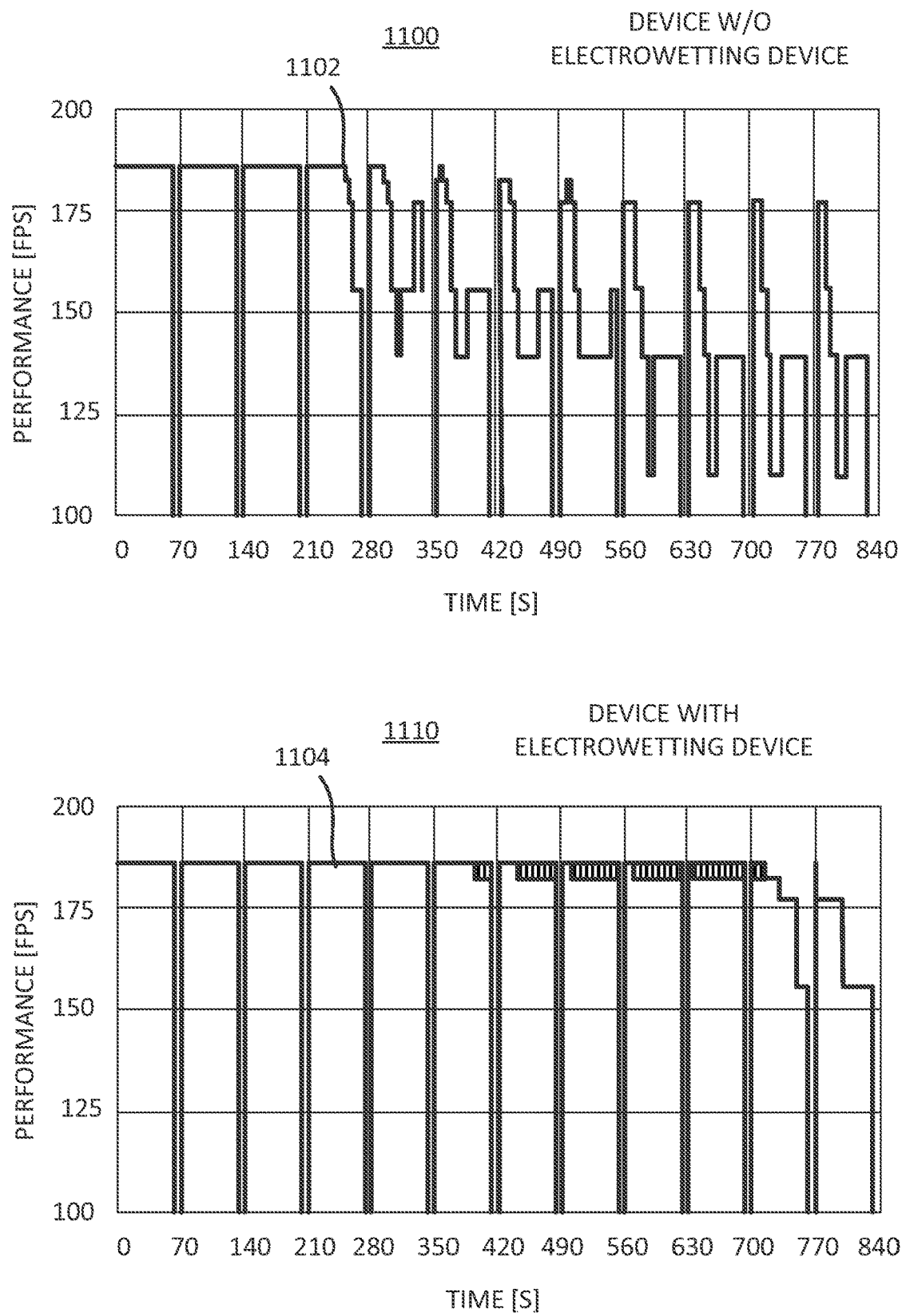
FIG. 11 illustrates operational performance over time of integrated devices for electronic devices with and without an electrowetting device.

FIG. 11 illustrates graphs of performance profiles over time of a device with and without an electrowetting device according to the present disclosure. FIG. 11 illustrates a graph 1100 of a performance profile 1102 of a device without an electrowetting device. As shown in FIG. 11, the performance profile 1102 shows that the device begins to throttle the performance of the integrated device right before 280 seconds in order to avoid temperature violations of the surface of the device. FIG. 11 also illustrates a graph 1110 of a performance profile 1104 of a device with an electrowetting device. As shown in FIG. 11, the performance profile 1104 shows that the device begins to throttle the performance of the integrated device around 730 seconds in order to avoid and/or address temperature violations of the surface of the device, which is substantially longer than that of the device without the electrowetting device. It is noted that before around the 730 seconds mark there might be junction temperature violations, which may cause the performance of the integrated device to be throttle on and off, as the junction temperature (e.g., temperature of the integrated device) may ramp up faster than the skin temperature. The big drop-off in the performance of the integrated device after the 730 seconds mark is due to skin temperature violations. It is noted that the graphs of FIG. 11 are merely exemplary. It is noted that the graphs of FIG. 11 are not meant to indicate that the device will operate exactly as shown in the graphs in every instances.

For surfaces of comparable size, the electrowetting device is able to increase the thermal power envelope of the device by as much as 35 percent, without diminishing the performance of the device. In some implementations, the electrowetting device may help reduce the surface temperature (e.g., skin temperature) of the device by about 10 percent (e.g., 4-5 degrees Celsius). In some implementations, the electrowetting device may help reduce the temperature gradient by about 95 percent. In some implementations, the electrowetting device may help reduce hotspot temperature rise over ambient temperature by about 25 percent. In some implementations, the electrowetting device may help reduce the thermal resistance of the junction-to-ambient by about 14 percent.

Figure 12:
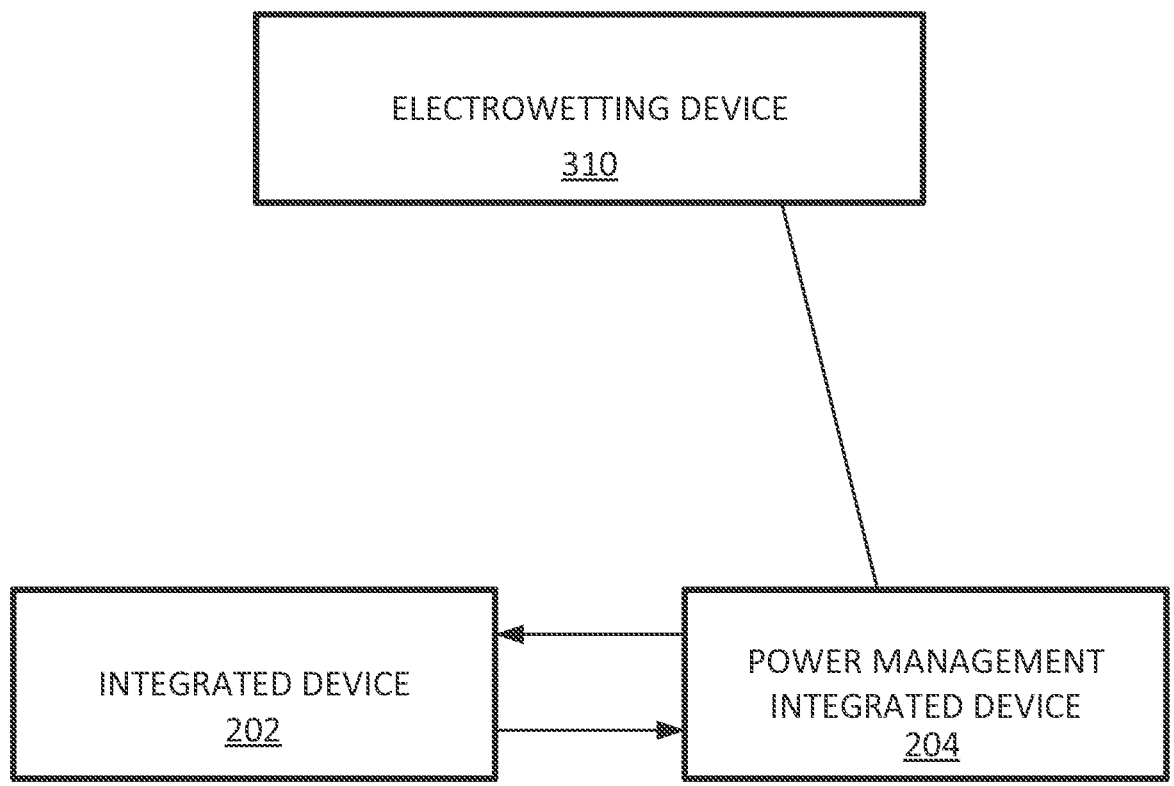
FIG. 12 illustrates a block diagram of an integrated device, a power management integrated device and an electrowetting device.

FIG. 12 illustrates a block diagram of how an electrowetting device may be conceptually coupled to one or more integrated devices. FIG. 12 illustrates an integrated device 202, an integrated device 204 and an electrowetting device 310. The integrated device 202 is configured to be electrically coupled to the integrated device 204. The integrated device 204 is configured to be electrically coupled to the electrowetting device 310. The integrated device 204 may include a power management integrated device. The integrated device 204 may be configured to provide and/or route power to the integrated device 202. For example, the device 100 may include an energy storage unit (e.g., battery) and power from the energy storage unit (e.g., battery) may be routed to the integrated device 202 through the integrated device 204. In some implementations, the integrated device 204 may be configured to provide one or more voltages to the electrowetting device 310 to operate the electrowetting device 310. The voltage(s) may be selectively applied to the plurality of electrodes 422 of the electrowetting device 310 to activate and/or deactivate individual electrodes. The voltage(s) that is provided at electrodes may produce one or more electrical fields, which causes the liquid 400 in the electrowetting device 310 to move, as described in at least FIG. 6. In some implementations, the decision(s) about which electrodes to turn on and/or off is made by the integrated device 204. Thus, in some implementations, the integrated device 204 controls the operation of the electrowetting device 310. However, in some implementations, the decision(s) about which electrodes to turn on and/or off is made by one or more other integrated devices. For example, in some implementations, the integrated device 202 may control the operation of the electrowetting device 310 through the integrated device 204. That is, the integrated device 202 may instruct the integrated device 204 which electrodes to turn on and/or off, and when to turn them on and/or off. In other words, the integrated device 202 may control operation of the electrodes, wherein controlling the operation may include controlling an amplitude and/or timing of individual voltages applied to individual electrodes. In some implementations, the integrated device 202 may control the operation of the electrowetting device 310 without going through the integrated device 204. In some implementations, the integrated device 202 may be configured to provide one or more voltages to the electrowetting device 310 to operate the electrowetting device 310. The integrated device 202 may be configured to be electrically coupled to the electrowetting device 310. The integrated device 202 may include a central process unit (CPU) of the device. However, as mentioned above, the integrated device 202 may include a GPU, a modem, and/or a multimedia processor. In some implementations, the integrated device 202 may include a thermal management unit of the device.

As will be further described below, decisions about when and which electrodes to turn on and/or off, (e.g., about a sequence of activating/deactivating individual electrodes), may be dependent on temperature readings by the device such as one or more temperatures measured by one or more corresponding temperature sensors of the device. Different implementations may use different temperature readings and/or temperature models. In some implementations, the thermal management decisions may be made based on surface temperatures (e.g., skin temperatures) of the device and/or temperatures (e.g., junction temperatures) of integrated devices in the device. As will be further described below, in some implementations, the thermal management decisions may be made based on estimated skin temperatures of the device. Temperature sensors may be used to provide readings to the integrated device 202 and/or the integrated device 204 of the device. The temperature sensors may be located in various locations of the device. In some implementations, the integrated device 202 and/or the integrated device 204 may include one or more temperature sensors. In some implementations, the electrowetting device 310 may include one or more temperature sensors. The temperature sensors may be configured to be electrically coupled to the integrated device 202 and/or the integrated device 204. Although not shown in FIG. 12, the integrated device 202 may be electrically coupled to the electrowetting device 310.

Figure 13:
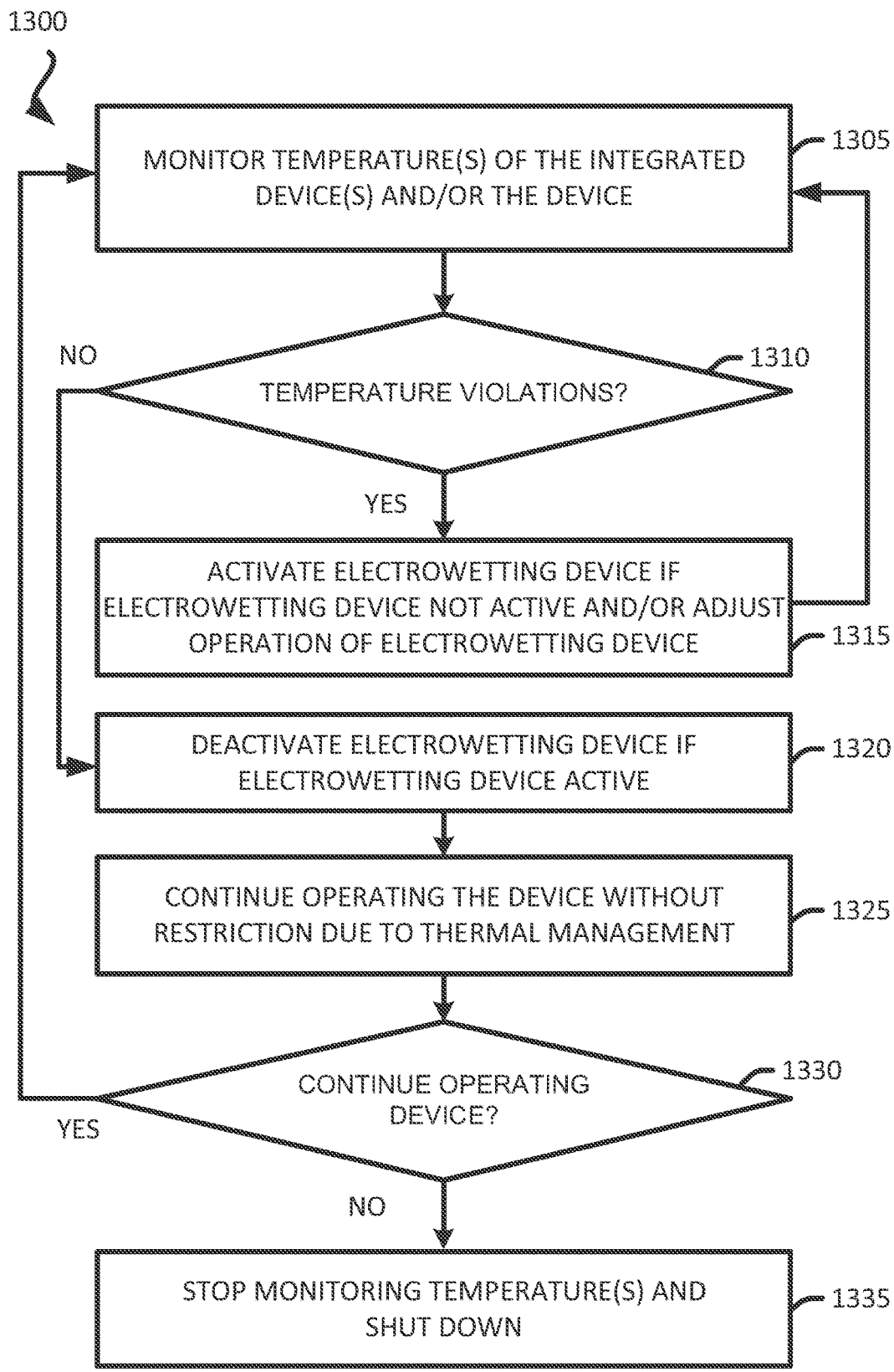
FIG. 13 illustrates an exemplary flow diagram of operating an electronic device with an electrowetting device.

Exemplary Flow Diagram of a Method for Thermal Management of a Device with an Electrowetting Device FIG. 13 illustrates a flow diagram of a method 1300 for thermal management of a device that includes an electrowetting device. The method 1300 may be performed by the device 100. In some implementations, the method 1300 may be performed by the integrated device 202 and/or the integrated device 204. The method 1300 may be an example of a method for thermal management of a device.

The method monitors (at 1305) one or more temperatures of the device (e.g., 100). For example, the method may monitor one or more temperature(s) (e.g., junction temperatures) of the integrated device(s) (e.g., 202, 204). The method may monitor one or more temperature(s) (e.g., surface/skin temperatures) of a surface (e.g., back surface) of the device. Monitoring one or more temperature(s) of a surface of the device may include monitoring one or more inner temperatures (e.g., temperature near a surface of the device, temperature near an element of the surface of the device) of the device. In some implementations, the method may monitor the skin temperature(s) of the device by using the temperature(s) of the integrated device(s) of the device. For example, estimates of skin temperatures may be determined by using temperature readings (e.g., junction temperature readings) of the integrated device 202 and/or the integrated device 204. In some implementations, temperature models and/or temperature tables that predict and/or estimate skin temperatures of the device based on the temperatures of the integrated device 202 and/or the integrated device 204 may be used.

In some implementations, monitoring temperatures of the device includes receiving temperature readings from one or more temperature sensors in the device. The temperature sensors may include temperature sensors of the integrated devices, temperature sensors of the electrowetting device, and/or temperature sensors of other components in the device.

The method determines (at 1310) whether the temperature readings violate any temperature criteria. For example, the method may determine whether the temperatures are higher than one or more threshold temperature values. Examples of threshold temperature values include threshold junction temperature values for junction temperatures (e.g., temperatures of integrated device) and threshold skin temperature values for skin temperatures (e.g., temperatures for surface(s) of a device). An example of a threshold skin temperature for a surface of a device is about 43 degrees Celsius (e.g., 42-44 degrees Celsius). Thus, the method may determine (at 1310) whether temperature readings may violate any junction temperature criteria and/or any skin temperature criteria. In some implementations, determining whether the temperature readings violate any temperature criteria includes determining whether the temperature readings are approaching or are close to threshold temperature values. In some implementations, determining whether the temperature readings violate any temperature criteria includes determining whether the temperature readings are above threshold temperature values. In some implementations, the method may compare (at 1310) the junction temperature readings to threshold temperature values. In some implementations, the method may compare (at 1310) the skin temperature readings to threshold temperature values. In some implementations, the method extrapolates and/or estimates (at 1310) the skin temperature(s) of the device based on temperature readings of the integrated device 202 and/or integrated device 204, and compares the extrapolated and/or estimated skin temperatures to the threshold temperature values. In some implementations, the method extrapolates and/or estimates (at 1310) the skin temperature(s) of the device based on temperature readings of other components inside the device, and compares the extrapolated and/or estimated skin temperatures to the threshold temperature values. The extrapolation and/or estimation of the skin temperatures may be based on temperature models and/or temperature tables. Even if extrapolated and/or estimated skin temperatures are used, the method may make separate determinations as to whether the temperature readings violate any junction temperature criteria and whether the extrapolated and/or estimated skin temperatures violate any skin temperature criteria.

If the method determines (at 1310) that one or more temperature readings (e.g., junction temperature readings, skin temperature readings, estimated skin temperatures) violate one or more temperature criteria, the method activates (at 1315) the electrowetting device 310 if the electrowetting device 310 is not already activated, and/or adjusts the operation of the electrowetting device 310 according to which temperature criteria is/are violated. Activating the electrowetting device 310 may include turning on and/or off electrodes of the electrowetting device 310. Adjusting the electrowetting device may include adjusting the speed at which the liquid 400 inside the electrowetting device 310 travels in the channel 405, e.g., by adapting a timing of the turning on and/or off of the electrodes. Activating and/or adjusting the electrowetting device 310 may include turning on and/or off only some of the electrodes for some of a plurality of loops of the at least one channel, while leaving one or more other loops inactive. In some implementations, the method activates and/or adjusts the electrowetting device 310 in order to provide a temperature distribution of a surface of the device that is uniform, and/or with a small or negligible temperature gradient. In some implementations, once the electrowetting device 310 is active and the liquid 400 has moved around the channels several times, the temperature gradient (e.g., temperature distribution) of the back surface of the device may be as low as 0.5 degrees Celsius (e.g., temperature gradient may be in a range of about 0.5-6 degrees Celsius). Thus, a steady state temperature gradient of the back surface of the device may be as low as 0.5 degrees Celsius (e.g., may be in a range of about 0.5-6 degrees Celsius). In some implementations, the type of adjustments that is made may be dependent on whether the violation is a junction temperature criteria violation and/or a skin temperature criteria violation.

Once the electrowetting device 310 is activated and/or adjusted, the method 1300 proceeds to 1305 to monitor the temperature readings of the device.

If the method determines (at 1310) that none of the temperature readings violate one or more temperature criteria, the method may deactivate (at 1320) the electrowetting device 310, if the electrowetting device 310 is active, or otherwise directly proceed to step 1325. Deactivating the electrowetting device 310 may include turning off all of the electrodes of the electrowetting device 310. In some implementations, the method may determine (at 1310) that the temperature readings do not violate any of the temperature criteria, if the temperature readings are approaching one or more temperature criteria and will satisfy the temperature criteria very shortly. In some implementations, the method may determine (at 1310) that the temperature readings do not violate any of the temperature criteria, if the temperature readings are below or equal to respective threshold temperature values.

The method continues (at 1325) to operate the device without any restriction due to thermal management. This may mean that the integrated device 202 and/or the integrated device 204 may operate without being instructed to throttle due to thermal management concerns. In some implementations, this may mean that the integrated device 202 and/or the integrated device 204 may operate without being instructed to throttle due to thermal management concerns of the skin temperature (e.g., surface temperature) of the device. It is noted that in some implementations, the device may be throttled (e.g., integrated device may be throttled), however such throttling happens less often than it would for a device that does not include an electrowetting device. In some implementations, the throttling of the integrated device may be held off for a much longer period of time than it would for a device that does not include an electrowetting device, as described in FIGS. 10 and 11. For example, a device with an electrowetting device may not need to throttle the device (e.g., throttle an integrated device) because of skin temperature violations for at least 280 seconds from when the device is turned on and/or operational. For example, a device with an electrowetting device may not need to throttle the device (e.g., throttle an integrated device) because of skin temperature violations until about 730 seconds from when the device is turned on and/or operational. It is noted that a device and/or an integrated device of the device may be throttled for other reasons that are not related to skin temperature violations (e.g., non-thermal criteria), such as electrical current limits in the device.

The method determines (at 1330) whether to continue to operate the device. If the method determines (at 1330) to continue operating the device, the method proceeds back to 1305 to monitor the temperatures of the device.

However, if the method determines (at 1330) not to continue to the operate the device, the method stops (at 1335) monitoring the temperatures of the device and may shut down.

Exemplary Electronic Devices

Figure 14:
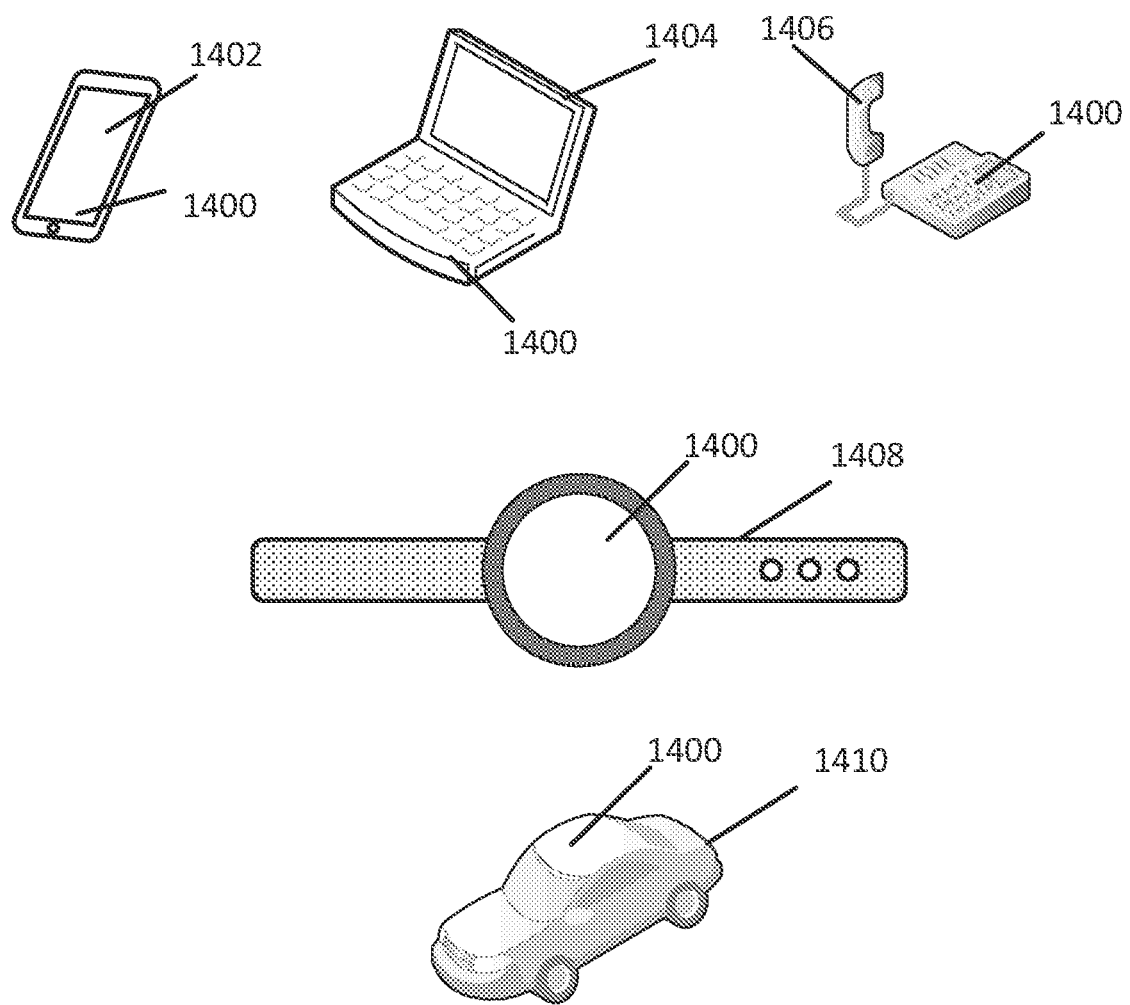
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses, virtual reality headset), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-14 may be rearranged and/or combined into a single component, process, feature, or function or embodied in several components, processes, or functions. Additional elements, components, processes, and/or functions may also be added without departing from the disclosure. It should also be noted FIGS. 1-14 and its corresponding description in the present disclosure is not limited to dies and/or ICs. In some implementations, FIGS. 1-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

One or more processors (e.g., core, integrated device) in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium.

The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may reside in a processing system, external to the processing system, or distributed across multiple entities including the processing system. The computer-readable medium may be embodied in a computer program product. In some examples, the computer-readable medium may be part of a memory. By way of example, a computer program product may include a computer-readable medium in packaging materials. Those skilled in the art will recognize how best to implement the described functionality presented throughout this disclosure depending on the particular application and the overall design constraints imposed on the overall system.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object that is coupled to another object may be coupled to part of the object or all of the object. The term "electrically coupled" may mean that two objects are directly or indirectly coupled together such that an electrical signal (e.g., current, voltage) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. There may or may not be one or more interfaces between interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A device comprising a first integrated device; a second integrated device configured to be electrically coupled to the first integrated device; and an electrowetting device configured to be electrically coupled to the second integrated device, wherein the electrowetting device is configured to redistribute heat across a surface of the device by moving a liquid in the electrowetting device, along a surface element of the device.

Aspect 2: The device of aspect 1, wherein the electrowetting device includes at least one channel and a plurality of electrodes arranged along the at least one channel and configured to move one or more droplets of the liquid along the at least one channel.

Aspect 3: The device of aspect 2, wherein the at least one channel includes at least one closed loop.

Aspect 4: The device of aspects 2 through 3, wherein the at least one channel is hermetically sealed.

Aspect 5: The device of aspects 2 through 4, wherein the electrowetting device is configured to move the one or more droplets in a liquid state along an entire length of the at least one channel.

Aspect 6: The device of aspects 2 through 5, wherein the liquid comprises water.

Aspect 7: The device of aspects 2 through 6, wherein the at least one channel is provided along the surface element of the device to transfer heat from at least one heat source of the device to at least one heat sink of the device.

Aspect 8: The device of aspect 7, wherein the at least one heat source includes at least one of the first integrated device or the second integrated device.

Aspect 9: The device of aspects 7 through 8, wherein the at least one heat sink includes a region of the surface element where no heat is generated during operation of the device.

Aspect 10: The device of aspects 2 through 9, wherein the electrowetting device comprises a first portion comprising a first base; a first plurality of electrodes coupled to the first base; and a first dielectric layer located over or on the first plurality of electrodes and the first base. The electrowetting device comprises a second portion facing the first portion and comprising: a second base; a metal layer coupled to the second base or a second plurality of electrodes coupled to the second base; a second dielectric layer located below or under the metal layer or the second plurality of electrodes, respectively, and the second base; the at least one channel extending between the first portion and the second portion; and the one or more droplets located in the at least one channel.

Aspect 11: The device of aspect 10, wherein the first dielectric layer has a hydrophobic property or a first hydrophobic layer is provided over or on the first dielectric layer; and/or wherein the second dielectric layer has a hydrophobic property or a second hydrophobic layer is provided below or under the second dielectric layer.

Aspect 12: The device of aspect 11, wherein respective electrodes of the first plurality of electrodes and the second plurality of electrodes across the at least one channel are coupled so as to be operated completely out of phase.

Aspect 13: The device of aspects 2 through 12, wherein the electrowetting device comprises: a first channel; a first liquid configured to travel through the first channel; a second channel; and a second liquid configured to travel through the second channel.

Aspect 14: The device of aspects 1 through 13, wherein the first integrated device is configured to control an operation of the electrowetting device through the second integrated device.

Aspect 15: The device of aspect 14, wherein the second integrated device includes a power management integrated device configured to provide a voltage to the electrowetting device.

Aspect 16: The device of aspects 1 through 15, wherein the first integrated device is configured to monitor at least one temperature of the device.

Aspect 17: The device of aspects 1 through 16, wherein the first integrated device is configured to monitor at least one temperature of the first integrated device.

Aspect 18: The device of aspects 1 through 17, wherein the first integrated device is configured to monitor at least one temperature of the surface of the device.

Aspect 19: The device of aspects 1 through 18, wherein the first integrated device is configured to monitor at least one temperature of the surface of the device by using a temperature of the first integrated device to estimate the temperature of the surface of the device.

Aspect 20: The device of aspects 1 through 19, wherein the electrowetting device is configured to redistribute heat across the surface of the device such that a temperature gradient of the surface of the device is in a range of about 0.5-6 degrees Celsius.

Aspect 21: The device of aspects 1 through 20, wherein the device includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and an electronic device in an automotive vehicle.

Aspect 22: A method for thermal management of a device. The method monitors at least one temperature of the device. The method determines whether the at least one temperature violates at least one temperature criterion. The method activates an electrowetting device upon determining that the at least one temperature violates the at least one temperature criterion, wherein activating the electrowetting device causes the electrowetting device to redistribute heat across a surface of the device by moving a liquid in the electrowetting device, along a surface element of the device.

Aspect 23: The method of aspect 22, wherein activating the electrowetting device comprises operating a plurality of electrodes arranged along at least one channel of the electrowetting device to move one or more droplets of the liquid along the at least one channel.

Aspect 24: The method of aspect 23, wherein activating the electrowetting device comprises moving the one or more droplets along at least one closed loop of the at least one channel.

Aspect 25: The method of aspects 23 through 24, wherein activating the electrowetting device comprises moving the one or more droplets in a liquid state along an entire length of the at least one channel.

Aspect 26: The method of aspects 22 through 25, wherein monitoring the at least one temperature is performed by a first integrated device, wherein determining whether the at least one temperature violates at least one temperature criterion is performed by the first integrated device, and wherein activating the electrowetting device comprises the first integrated device instructing a second integrated device to activate the electrowetting device.

Aspect 27: The method of aspects 22 through 26, wherein monitoring the at least one temperature of the device includes monitoring a temperature of a first integrated device.

Aspect 28: The method of aspects 22 through 27, wherein monitoring the at least one temperature of the device includes monitoring a temperature of the surface of the device.

Aspect 29: The method of aspects 22 through 28, wherein monitoring the at least one temperature of the device includes monitoring a temperature of the surface of the device by using a temperature of a first integrated device to estimate the temperature of the surface of the device.

Aspect 30: The method of aspects 22 through 29, wherein activating the electrowetting device comprises activating the electrowetting device to redistribute heat across the surface of the device such that a temperature gradient of the surface of the device is in a range of about 0.5-6 degrees Celsius.

Aspect 31: An apparatus comprising an integrated device and means for electrowetting configured to be electrically coupled to the integrated device, wherein the means for electrowetting is configured to redistribute heat across a surface of the device by moving a liquid in the means for electrowetting, along a surface element of the apparatus.

Aspect 32: The apparatus of aspect 31, wherein the electrowetting device includes at least one channel and a plurality of electrodes arranged along the at least one channel and configured to move one or more droplets of the liquid along the at least one channel.

Aspect 33: The apparatus of aspects 31 through 32, further comprising another integrated device configured to control an operation of the electrowetting device through the integrated device.

Aspect 34: The apparatus of aspects 31 through 33, wherein the integrated device includes a power management integrated device configured to provide a voltage to the electrowetting device.

Aspect 35: The apparatus of aspects 33 through 34, wherein the another integrated device is configured to monitor at least one temperature of the apparatus.

Aspect 36: The apparatus of aspects 33 through 35, wherein the another integrated device is configured to monitor at least one temperature of the another integrated device.

Aspect 37: The apparatus of aspects 33 through 36, wherein the another integrated device is configured to monitor at least one temperature of the surface of the apparatus.

Aspect 38: The apparatus of aspects 33 through 37, wherein the another integrated device is configured to monitor at least one temperature of the surface of the apparatus by using a temperature of the another integrated device to estimate the temperature of the surface of the apparatus.

Aspect 39: The apparatus of aspects 31 through 38, wherein the electrowetting device is configured to redistribute heat across the surface of the apparatus such that a temperature gradient of the surface of the apparatus is in a range of about 0.5-6 degrees Celsius.

Aspect 40: The apparatus of aspects 31 through 39, wherein moving a liquid in the means for electrowetting, along a surface element of the apparatus comprises moving the liquid in the electrowetting device next to the surface element of the apparatus.

Aspect 41: A device comprising an integrated device and an electrowetting device configured to be electrically coupled to the integrated device, wherein the electrowetting device is configured to redistribute heat across a surface of the device by moving a liquid in the electrowetting device, along a surface element of the device.

Aspect 42: The device of aspect 41, wherein the electrowetting device includes at least one channel and a plurality of electrodes arranged along the at least one channel and configured to move one or more droplets of the liquid along the at least one channel.

Aspect 43: The device of aspects 41 through 42, further comprising another integrated device configured to control an operation of the electrowetting device through the integrated device.

Aspect 44: The device of aspects 41 through 43, wherein the integrated device includes a power management integrated device configured to provide a voltage to the electrowetting device.

Aspect 45: The device of aspects 43 through 44, wherein the another integrated device is configured to monitor at least one temperature of the device.

Aspect 46: The device of aspects 43 through 45, wherein the another integrated device is configured to monitor at least one temperature of the another integrated device.

Aspect 47: The device of aspects 43 through 46, wherein the another integrated device is configured to monitor at least one temperature of the surface of the device.

Aspect 48: The device of aspects 43 through 47, wherein the another integrated device is configured to monitor at least one temperature of the surface of the device by using a temperature of the another integrated device to estimate the temperature of the surface of the device.

Aspect 49: The device of aspects 41 through 48, wherein the electrowetting device is configured to redistribute heat across the surface of the device such that a temperature gradient of the surface of the device is in a range of about 0.5-6 degrees Celsius.

Aspect 50: The device of aspects 41 through 49, wherein moving a liquid in the electrowetting device, along a surface element of the device comprises moving the liquid in the electrowetting device next to a surface element of the device.

Aspect 51: The device of aspects 43 through 50, wherein the integrated device may be configured to provide and/or route power to the another integrated device.

Aspect 52: The device of aspect 51, further comprising a battery, and wherein power from the battery is provided to the another integrated device through the integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising: a first integrated device; a second integrated device configured to be electrically coupled to the first integrated device; and an electrowetting device configured to be electrically coupled to the second integrated device, wherein the electrowetting device is configured to redistribute heat across a surface of the device by moving a liquid in the electrowetting device, along a surface element of the device; wherein the electrowetting device comprises: a first portion comprising: a first base; a first plurality of electrodes coupled to the first base; and a first dielectric layer located over or on the first plurality of electrodes and the first base; and a second portion facing the first portion and above the first portion and comprising: a second base; a metal layer coupled to the second base; and a second dielectric layer located below or under the metal layer and the second base.

2. The device of claim 1, wherein the electrowetting device includes at least one channel and the first plurality of electrodes arranged along the at least one channel and configured to move one or more droplets of the liquid along the at least one channel.

3. The device of claim 2, wherein the at least one channel includes at least one closed loop.

4. The device of claim 2, wherein the at least one channel is hermetically sealed.

5. The device of claim 2, wherein the electrowetting device is configured to move the one or more droplets in a liquid state along an entire length of the at least one channel.

6. The device of claim 2, wherein the liquid comprises water.

7. The device of claim 2, wherein the at least one channel is provided along the surface element of the device to transfer heat from at least one heat source of the device to a region of the surface element where no heat is generated during operation of the device.

8. The device of claim 7, wherein the at least one heat source includes at least one of the first integrated device or the second integrated device.

9. The device of claim 2, wherein
the at least one channel extending between the first portion and the second portion; and
the one or more droplets located in the at least one channel.

10. The device of claim 9,
wherein the first dielectric layer has a hydrophobic property or a first hydrophobic layer is provided over or on the first dielectric layer; and/or
wherein the second dielectric layer has a hydrophobic property or a second hydrophobic layer is provided below or under the second dielectric layer.

11. The device of claim 2, wherein the electrowetting device comprises:
a first channel;
a first liquid configured to travel through the first channel;
a second channel; and
a second liquid configured to travel through the second channel.

12. The device of claim 1, wherein the first integrated device is configured to control an operation of the electrowetting device through the second integrated device.

13. The device of claim 12, wherein the second integrated device includes a power management integrated device configured to provide a voltage to the electrowetting device.

14. The device of claim 1, wherein the first integrated device is configured to monitor at least one temperature of the device.

15. The device of claim 1, wherein the first integrated device is configured to monitor at least one temperature of the first integrated device.

16. The device of claim 1, wherein the first integrated device is configured to monitor at least one temperature of the surface of the device.

17. The device of claim 1, wherein the first integrated device is configured to monitor at least one temperature of the surface of the device by using a temperature of the first integrated device to estimate the temperature of the surface of the device.

18. The device of claim 1, wherein the electrowetting device is configured to redistribute heat across the surface of the device such that a temperature gradient of the surface of the device is in a range of 0.5-6 degrees Celsius.

19. The device of claim 1, wherein the device includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and an electronic device in an automotive vehicle.

20. A method for thermal management of a device, comprising: monitoring at least one temperature of the device; determining whether the at least one temperature violates at least one temperature criterion; and activating an electrowetting device upon determining that the at least one temperature violates the at least one temperature criterion, wherein activating the electrowetting device causes the electrowetting device to redistribute heat across a surface of the device by moving a liquid in the electrowetting device, along a surface element of the device, wherein the electrowetting device comprises: a first portion comprising: a first base; a first plurality of electrodes coupled to the first base; and a first dielectric layer located over or on the first plurality of electrodes and the first base; and a second portion facing the first portion and above the first portion and comprising: a second base; a metal layer coupled to the second base; and a second dielectric layer located below or under the metal layer and the second base.

21. The method of claim 20, wherein activating the electrowetting device comprises operating the first plurality of electrodes arranged along at least one channel of the electrowetting device to move one or more droplets of the liquid along the at least one channel.

22. The method of claim 21, wherein activating the electrowetting device comprises moving the one or more droplets along at least one closed loop of the at least one channel.

23. The method of claim 21, wherein activating the electrowetting device comprises moving the one or more droplets in a liquid state along an entire length of the at least one channel.

24. The method of claim 20,
wherein monitoring the at least one temperature is performed by a first integrated device,
wherein determining whether the at least one temperature violates at least one temperature criterion is performed by the first integrated device, and
wherein activating the electrowetting device comprises the first integrated device instructing a second integrated device to activate the electrowetting device.

25. The method of claim 20, wherein monitoring the at least one temperature of the device includes monitoring a temperature of a first integrated device.

26. The method of claim 20, wherein monitoring the at least one temperature of the device includes monitoring a temperature of the surface of the device.

27. The method of claim 20, wherein monitoring the at least one temperature of the device includes monitoring a temperature of the surface of the device by using a temperature of a first integrated device to estimate the temperature of the surface of the device.

28. The method of claim 20, wherein activating the electrowetting device comprises activating the electrowetting device to redistribute heat across the surface of the device such that a temperature gradient of the surface of the device is in a range of 0.5-6 degrees Celsius.

29. An apparatus comprising: a first integrated device; and means for electrowetting configured to be electrically coupled to the first integrated device, wherein the means for electrowetting is configured to redistribute heat across a surface of the device by moving a liquid in the means for electrowetting, along a surface element of the apparatus: wherein the means for electrowetting comprises: a first portion comprising: a first base; a first plurality of electrodes coupled to the first base; and a first dielectric layer located over or on the first plurality of electrodes and the first base; and a second portion facing the first portion and above the first portion and comprising: a second base; a metal layer coupled to the second base; and a second dielectric layer located below or under the metal layer and the second base.

30. The apparatus of claim 29, wherein the means for electrowetting includes at least one channel and a plurality of electrodes arranged along the at least one channel and configured to move one or more droplets of the liquid along the at least one channel.

31. The apparatus of claim 29, further comprising a second integrated device configured to control an operation of the means for electrowetting through the first integrated device.

32. The apparatus of claim 31, wherein the first integrated device includes a power management integrated device configured to provide a voltage to the means for electrowetting.

33. The apparatus of claim 31, wherein the second integrated device is configured to monitor at least one temperature of the apparatus.

34. The apparatus of claim 31, wherein the second integrated device is configured to monitor at least one temperature of the second integrated device.

35. The apparatus of claim 31, wherein the second integrated device is configured to monitor at least one temperature of the surface of the apparatus.

36. The apparatus of claim 31, wherein the second integrated device is configured to monitor at least one temperature of the surface of the apparatus by using a temperature of the second integrated device to estimate the temperature of the surface of the apparatus.

* * * * *